(12) United States Patent
Inden

(10) Patent No.: US 12,519,388 B2
(45) Date of Patent: Jan. 6, 2026

(54) ELECTRONIC CONTROL UNIT

(71) Applicant: DENSO CORPORATION, Kariya (JP)

(72) Inventor: Yuki Inden, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 18/600,915

(22) Filed: Mar. 11, 2024

(65) Prior Publication Data

US 2024/0333144 A1 Oct. 3, 2024

(30) Foreign Application Priority Data

Mar. 27, 2023 (JP) .................................. 2023-049961

(51) Int. Cl.
*H02M 3/06* (2006.01)
*H03K 17/56* (2006.01)

(52) U.S. Cl.
CPC .............. *H02M 3/06* (2013.01); *H03K 17/56* (2013.01); *H03K 2217/0063* (2013.01); *H03K 2217/0072* (2013.01)

(58) Field of Classification Search
CPC .......... H02M 3/06; H02M 1/32; H02M 3/158; H03K 17/56; H03K 2217/0063; H03K 2217/0072
See application file for complete search history.

(56) References Cited

U.S. PATENT DOCUMENTS

| | | | |
|---|---|---|---|
| 2009/0015223 A1* | 1/2009 | Kakehi | H02M 3/00 323/282 |
| 2009/0183714 A1 | 7/2009 | Mayuzumi | |
| 2018/0278145 A1* | 9/2018 | Takagi | G01R 31/40 |

FOREIGN PATENT DOCUMENTS

| | | |
|---|---|---|
| JP | 2016-160919 A | 9/2016 |
| JP | 2019143520 A * | 8/2019 |

* cited by examiner

*Primary Examiner* — Metasebia T Retebo
(74) *Attorney, Agent, or Firm* — Posz Law Group, PLC

(57) ABSTRACT

An electronic control unit includes a booster circuit, a high-side switch, multiple low-side switches, a controller, a diode and a Zener diode. The booster circuit charges a booster capacitor to boost a power supply voltage supplied from a battery. The high-side switch drives an inductive load with a current through an output voltage of the booster circuit and the power supply voltage. The low-side switches are selectively turned on or off to control individual cylinders in an internal combustion engine. The controller controls the booster circuit, the high-side switch, and the low-side switches. The diode allows a current to flow back to the booster capacitor from a connection node between the inductive load and the low-side switches. The Zener diode is connected between the diode and the battery. The Zener diode clamps a voltage applied to the booster capacitor.

10 Claims, 8 Drawing Sheets

ELECTRONIC CONTROL UNIT

CROSS REFERENCE TO RELATED APPLICATION

This application is based on Japanese Patent Application No. 2023-049961 filed on Mar. 27, 2023, the disclosure of which is incorporated herein by reference.

TECHNICAL FIELD

The present disclosure relates to an electronic control unit.

BACKGROUND

An electronic control unit may boost a power supply voltage supplied from a battery by adopting a booster circuit to drive an inductive load with a current.

SUMMARY

The present disclosure describes an electronic control unit including a booster circuit, a high-side switch, multiple low-side switches, and a controller.

DETAILED DESCRIPTION

A comparative electronic control unit may eliminate an over-boosted state by discharging an excessive voltage to a battery when a voltage charged to the booster capacitor excessively rises at a time of regenerating a current due to a back electromotive force. The back electromotive force may be generated when the power supply to the inductive load is stopped.

However, in the above-mentioned comparative electronic unit, when the back electromotive force generated in the inductive load flows back, it may pass through a booster circuit. Since the back electromotive force cannot flow back to a battery until a moment after the completion of a boost switching operation, the back electromotive force may be forced to flow back to a booster capacitor for a certain period of time. In other words, the over-boosted state may not be reliably eliminated.

According to a first aspect of the present disclosure, an electronic control unit includes a booster circuit, a high-side switch, multiple low-side switches, a controller, a diode and a Zener diode. The booster circuit charges a booster capacitor to boost a power supply voltage supplied from a battery. The high-side switch drives an inductive load with a current by an output voltage of the booster circuit and the power supply voltage. The low-side switches are selectively turned on or off to control individual cylinders in an internal combustion engine. The controller controls the booster circuit, the high-side switch, and the low-side switches. The diode allows a current to flow back to the booster capacitor from a connection node between the inductive load and the low-side switches. The Zener diode is connected between the diode and the battery. The Zener diode clamps a voltage applied to the booster capacitor.

According to such a configuration, when an EMF current is regenerated at the booster circuit through the diode, the Zener diode enters a breakdown state as the voltage of the booster capacitor rises. Therefore, the anode potential of the diode is clamped to a value acquired by adding the Zener voltage to the battery voltage. The EMF current described above is induced by a back electromotive force (EMF) generated at a time of stopping the power supply to the inductive load. Accordingly, it is possible to reliably prevent the booster capacitor from being the over-boosted state without stopping the boosting operation of the booster circuit, and to allow the generated back electromotive force to flow back to the battery.

According to a second aspect of the present disclosure, the Zener voltage of the Zener diode is set to be larger than a set value of the output voltage of the booster circuit while a value acquired by adding the Zener voltage to the power supply voltage is set to be smaller than the breakdown voltage of the booster capacitor. Therefore, it is possible to reliably protect the circuit.

First Embodiment

Figure 1:
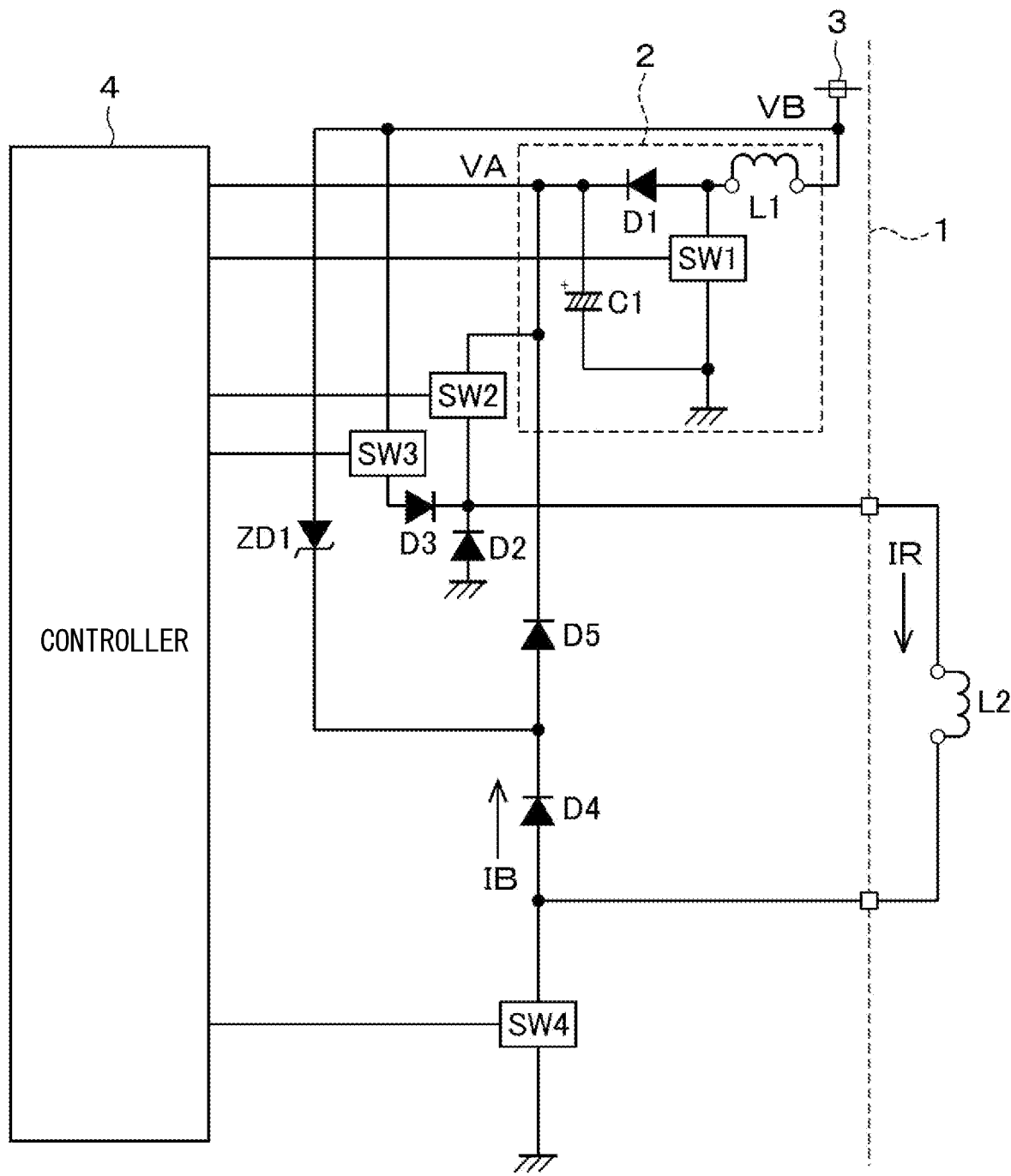
FIG. 1 illustrates a configuration of an electronic control unit according to a first embodiment.

For example, as illustrated in FIG. 1, an electronic control unit 1 according to the present embodiment drives a fuel injection valve in an internal combustion engine of a vehicle. The electronic control unit 1 includes a booster circuit 2, and generates a voltage VA acquired by boosting a power supply voltage VB of a battery 3. The booster circuit 2 includes a series circuit in which a coil L1, a diode D1 and a booster capacitor C1 are connected in series, and the series circuit is connected between the battery 3 and a ground. A transistor SW1 as a booster control switch is connected between an anode of the diode D1 and the ground. The cathode of the diode D1 is an output terminal for the boosted output voltage VA, and its output terminal is connected to an input terminal of a controller 4. The controller 4 turns on or off the transistor SW1, and monitors the boosted output voltage VA.

A series circuit in which a transistor SW3, a diode D3, a coil L2 and a transistor SW4 are connected in series is connected between the battery 3 and the ground. The transistor SW3 is a high-side switch. The transistor SW4 is a low-side switch. The coil L2 is provided externally to the electronic control unit 1. A series circuit in which a transistor SW2 and a diode D2 in reverse bias are connected in series between the output terminal of the booster circuit 2 and the ground. The transistor SW2 is a high-side booster output switch. The cathode of the diode D2 is connected to the cathode of the diode D3. A series circuit in which a diode D5 and a diode D4 being in reverse bias are connected in series is connected between the output terminal of the booster circuit 2 and the transistor SW4. The anode of a Zener diode ZD1 is connected to the battery 3, and the cathode of the Zener diode ZD1 is connected to an anode of the diode D5.

Multiple sets of the coil L2 and the transistor SW4 are present according to the number of cylinders in the internal combustion engine. The coil L2 is an inductive load. The transistors SW1 to SW4 are, for example, N-channel MOSFETs. The controller 4 controls the transistors SW2 to SW4 to be turned on or off. The controller 4 includes, for example, a microcomputer.

The following describes an operation in the present embodiment. First, the controller 4 charges the booster capacitor C1 by repeatedly switching on/off the transistor SW1 of the booster circuit 2 before starting the control of electrical conduction of the coil L2. Specifically, when the transistor SW1 is turned on, a current flows through a path including the coil L1 and the transistor SW1. Thereafter, when the transistor SW1 is turned off, the back electromotive force is generated in the coil L1, so that the capacitor C1 is charged with a voltage higher than the battery voltage VB. During this time, the controller 4 turns off the transistors SW2 to SW4.

Figure 2:
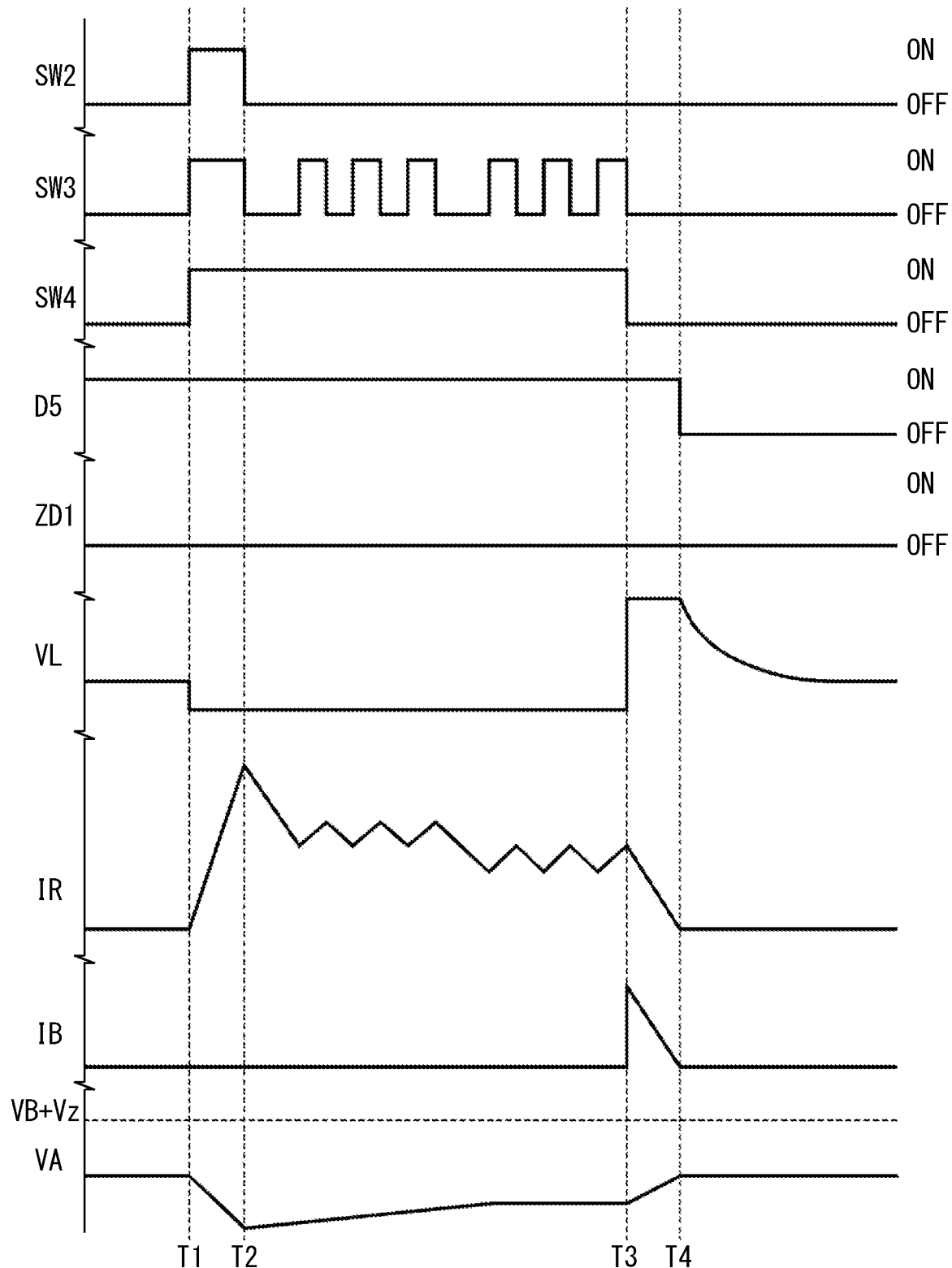
FIG. 2 is a timing chart that indicates a circuit operation in a case where a boosted output voltage is within a normal range.

As shown in FIG. 2, since the boosted output voltage VA during a normal operation is set to be lower than the sum of the voltage VB of the battery 3 and the Zener voltage Vz of the Zener diode ZD1, the diode D5 is being turned on. The controller 4 simultaneously turns on the transistors SW2 to SW4 at time T1 to electrically conduct and drive the coil L2 included in the injector. The transistor SW4 provided for the selected cylinder in relation to a fuel injection valve is turned on. At this time, since the boosted output voltage VA is higher than the battery voltage VB, the boosted output voltage VA is applied to the coil L2 and the fuel injection valve opens. The boosted output voltage VA decreases as the capacitor C1 discharges.

Next, when the controller 4 turns off the transistors SW2 and SW3 at time T2, the controller 4 executes on/off switching control of the transistor SW3 so that a current IR flowing through the coil L2 is within a predetermined target range. As a result, the battery voltage VB is intermittently applied to the coil L2, and the fuel injection valve is maintained in an opened state. Additionally, the controller 4 executes on/off switching control of the transistor SW1 until a value of the boosted output voltage VA reaches a predetermined value, and charges the booster capacitor C1. Although FIG. 2 illustrates a situation where the target range of the current IR flowing through the coil L2 decreases in two stages, the target range may be decreased in one stage or in three or more stages.

Subsequently, the controller 4 turns off the transistors SW3 and SW4 at time T3. As a result, the current IR flowing through the coil L2 decreases and the fuel injection valve closes. At this time, the current IR flowing through the coil L2 decreases, so that the back electromotive force is generated in the coil L2. A current IB due to this back electromotive force returns to the output terminal of the booster circuit 2 via the diodes D4 and D5. As a result, the booster capacitor C1 is charged and the boosted output voltage VA increases. The diode D5 is turned off after the current IB flows. From now on, the controller 4 executes the identical operation as described above, starting from time T2, by turning on the transistors SW2 to SW4 at the timing when the fuel injection valve should be opened next.

Figure 3:
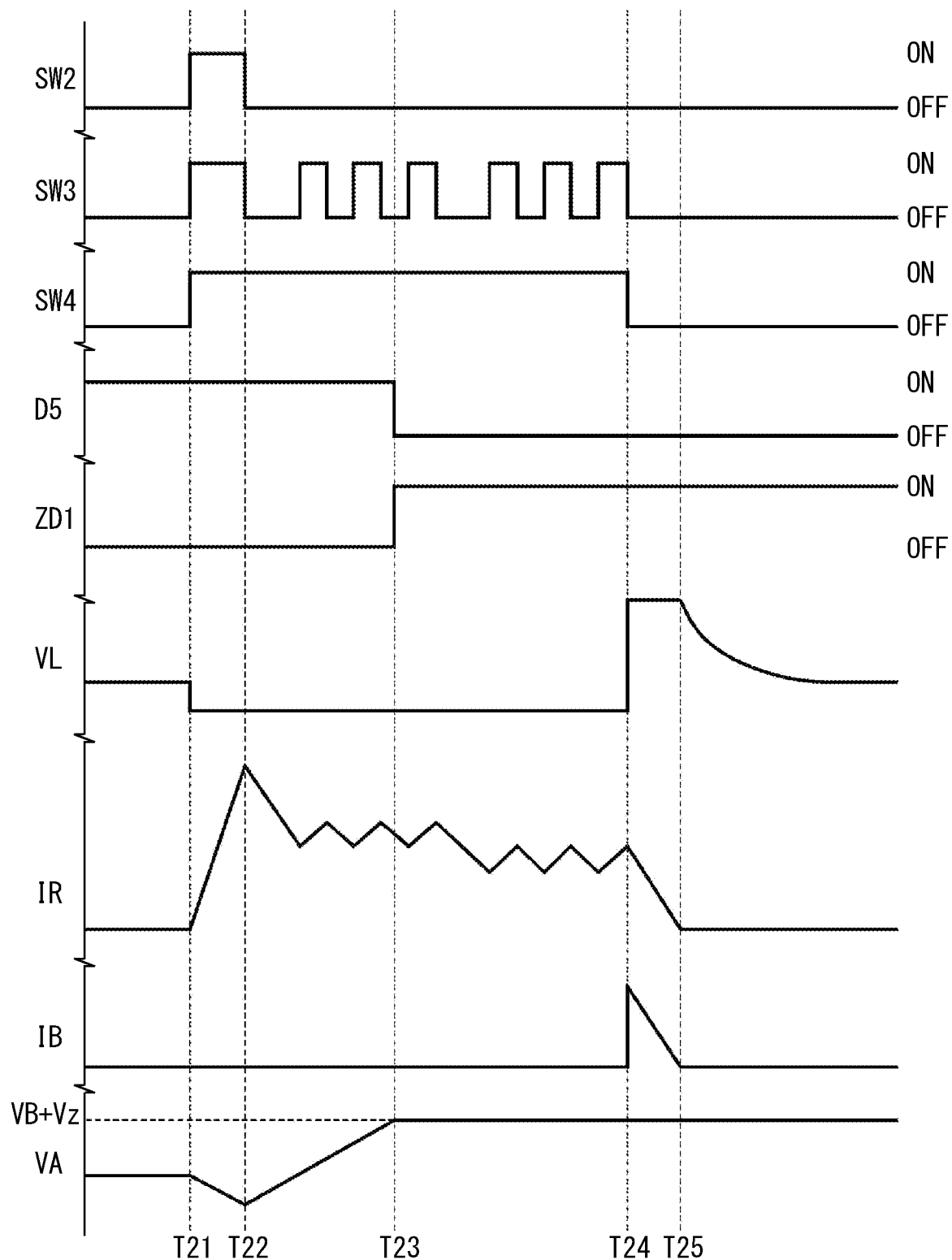
FIG. 3 is a timing chart that indicates a circuit operation in a case where the boosted output voltage is in an over-boosted state.
Figure 4:
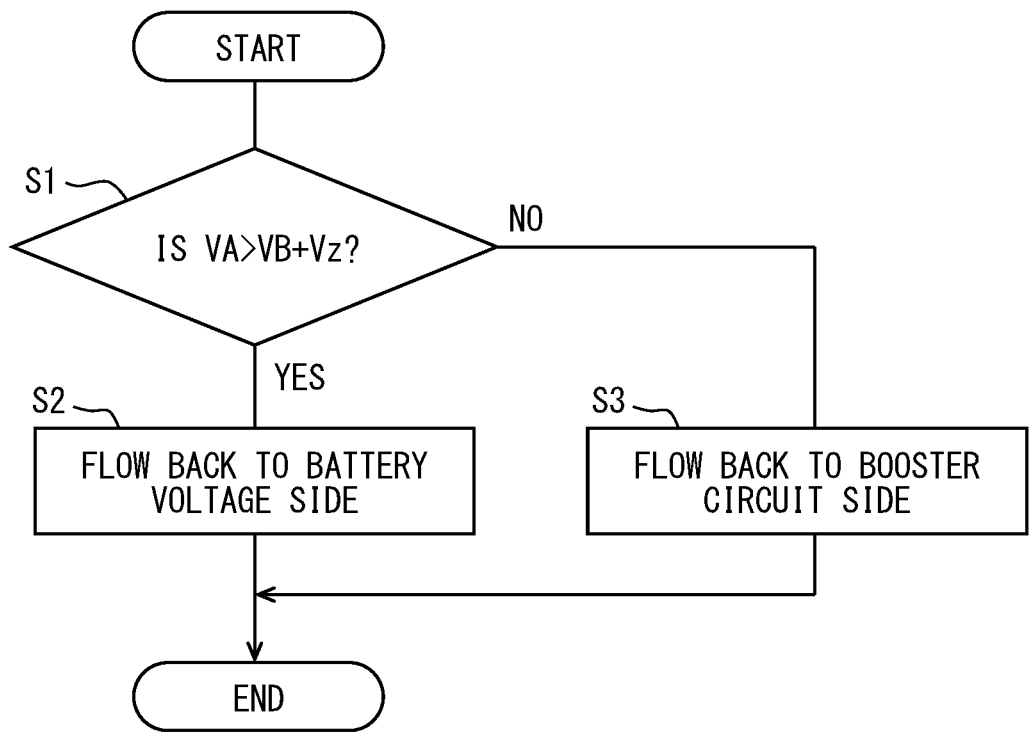
FIG. 4 is a flowchart that indicates a circuit operation for switching a backflow path.

On the other hand, as illustrated in FIG. 3, when the voltage of the booster capacitor C1 due to backflow excessively rises and the boosted output voltage VA becomes higher than the sum of the Zener voltage Vz and the battery voltage VB, the Zener diode ZD1 enters Zener breakdown. Therefore, the current is switched to flow back to the battery 3 via the Zener diode ZD1. The Zener voltage Vz may be set to be larger than, for example, the set value of the boosted output voltage VA of the booster circuit 2 so that the sum voltage of the voltage VB and the voltage Vz is lower than the breakdown voltage of the booster capacitor C1. FIG. 4 is a flowchart showing the circuit operation for switching the backflow path.

According to the present embodiment, the booster circuit 2 charges the booster capacitor C1 with the power supply voltage VB supplied from the battery 3 to boost the voltage. The transistors SW2 and SW3 drive the coil L2 with a current based on the boosted output voltage VA of the booster circuit 2 and the power supply voltage VB of the battery 3, and the transistor SW4 is selectively turned on or off to control each cylinder in the internal combustion engine. The controller 4 controls the booster circuit 2 and the transistors SW2 to SW4. The diode D4 causes the current to flow back from a connection node between the coil L2 and the transistor SW4 to the booster capacitor C1. The Zener diode ZD1 is connected between the diode D4 and the battery 3, and clamps a voltage applied to the booster capacitor C1.

With such a configuration, when the current due to the back electromotive force generated at the time of stopping power supply to the coil L2 is regenerated at the booster circuit 2 via the diodes D4 and D5, the Zener diode enters a breakdown state due to an increase in the voltage of the booster capacitor C1. The anode potential of the diode D4 is clamped to a value acquired by adding the Zener voltage Vz to the battery voltage VB. Therefore, through only the hardware operation, it is possible to reliably avoid the booster capacitor C1 from turning to an over-boosted state without stopping the boosting operation of the booster circuit 2, and to cause the generated back electromotive force to flow back to the battery 3. At this time, the Zener voltage Vz of the Zener diode ZD1 is set to be larger than the set value of the boosted output voltage VA of the booster circuit 2, and the voltage (VB+Vz) is lower than the breakdown voltage of the booster capacitor C1, so that the circuit can be more reliably protected.

Second Embodiment

Figure 5:
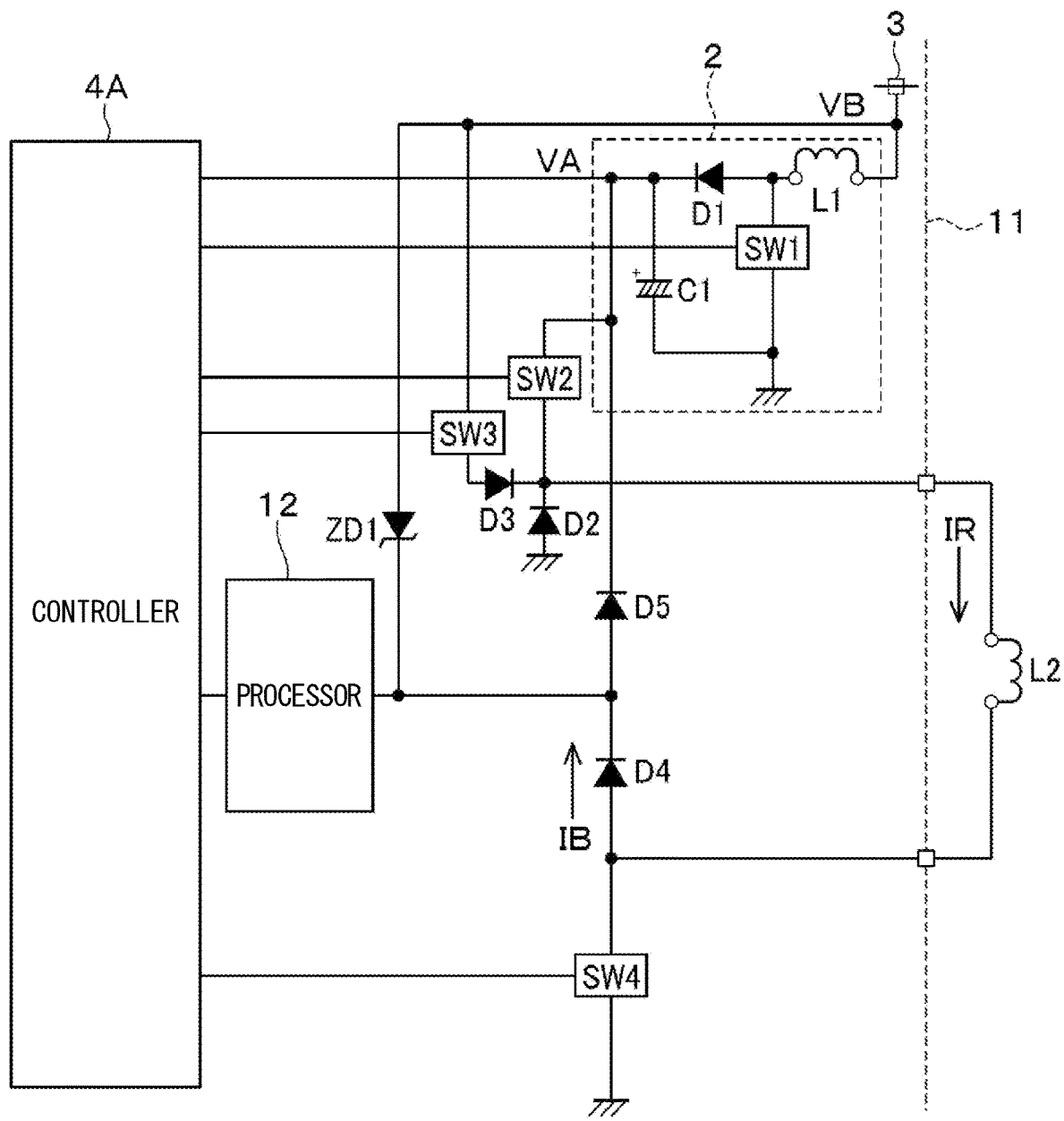
FIG. 5 illustrates a configuration of an electronic control unit according to a second embodiment.

Hereinafter, the same components as those of the first embodiment are denoted by the same reference numerals, and descriptions of the same components will be omitted, and different portions will be described. As shown in FIG. 5, an electronic control unit 11 according to a second embodiment includes a processor 12. An input terminal of the processor 12 is connected to a cathode of the diode D4, and an output terminal of the processor 12 is connected to a controller 4A. The processor 12 monitors the cathode potential described above.

Figure 6:
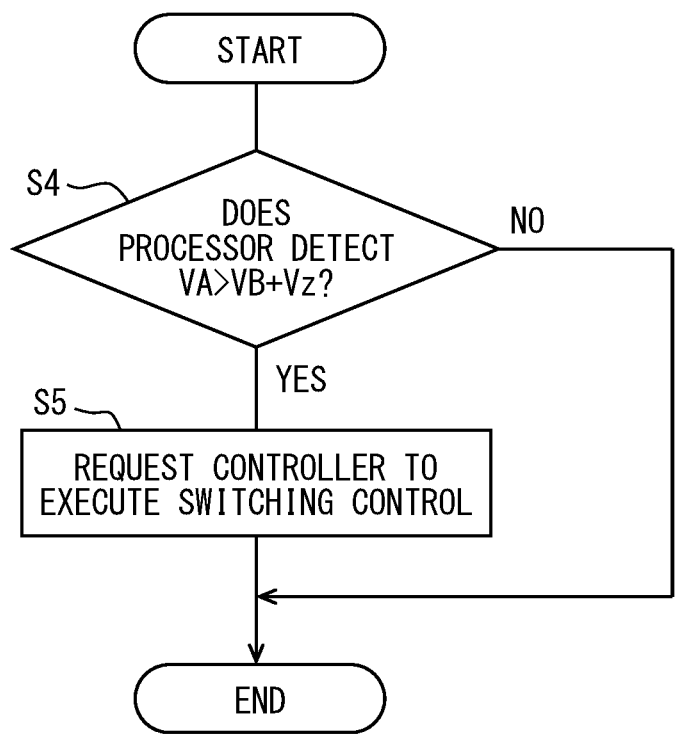
FIG. 6 is a flowchart that indicates a control content of a processor.

The following describes an operation in the second embodiment. As shown in FIG. 6, as the processor 12 monitors the cathode potential of the diode D4, in a case where the processor 12 detects that the boosted output voltage VA is greater than the sum of VB and Vz and the Zener diode ZD1 enters the Zener breakdown state (S4: YES), the processor 12 outputs a request of switching control to the controller 4A in S5. For example, upon receiving the request, the controller 4A stops the switching of the transistor SW1 to stop the operation of the booster circuit 2, and turns off all of the transistors SW2 to SW4 to stop electrical conduction of the coil L2. The above operations correspond to over-boosting elimination control. Both of the operations may be executed simultaneously, or only one of the operations may be executed.

According to the second embodiment, since the controller 4A executes the over-boosting elimination control through the processor 12 according to the cathode potential of the diode D4, it is possible to reliably protect the circuit from overvoltage.

Third Embodiment

Figure 7:
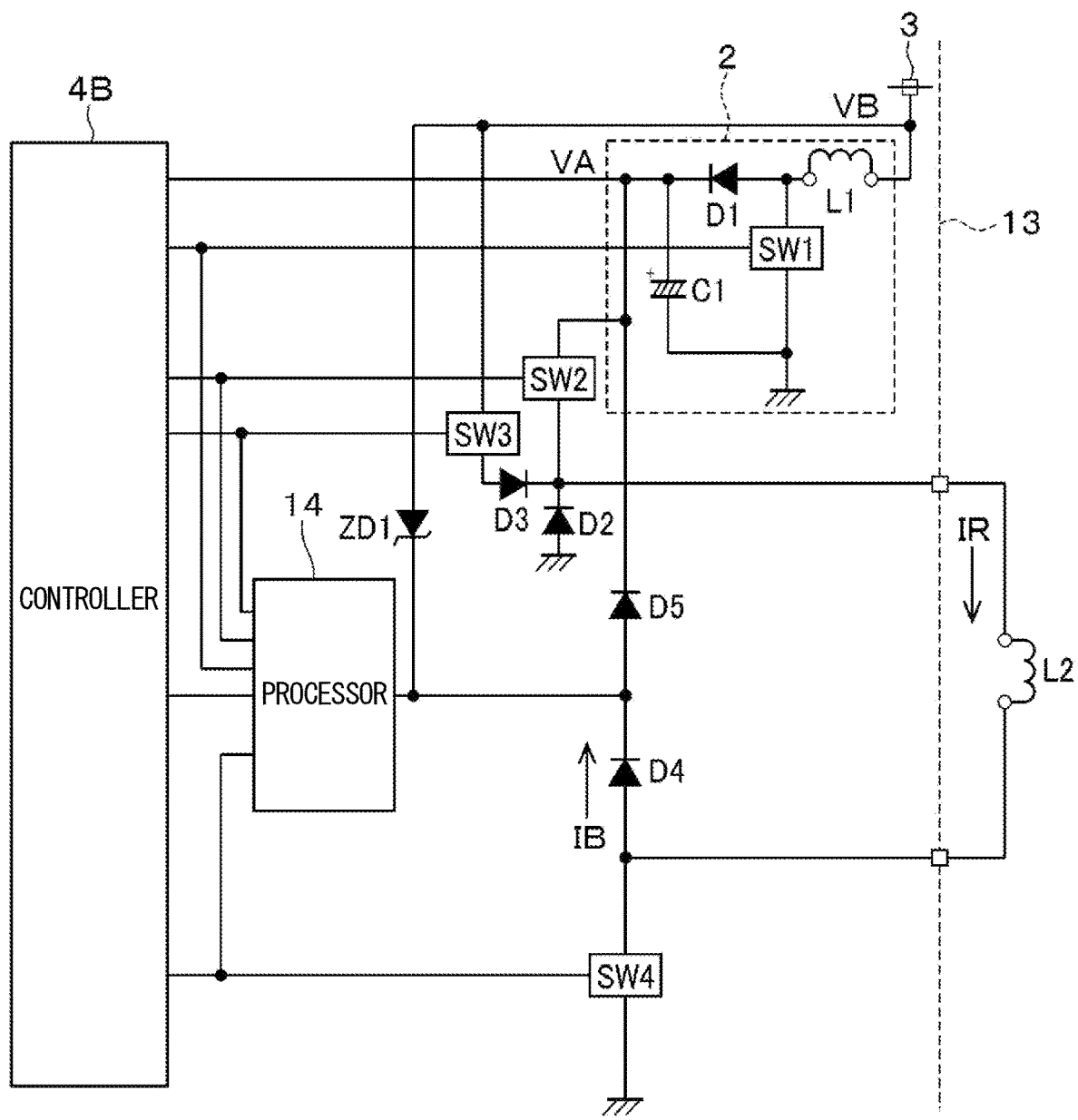
FIG. 7 illustrates a configuration of an electronic control unit according to a third embodiment.
Figure 8:
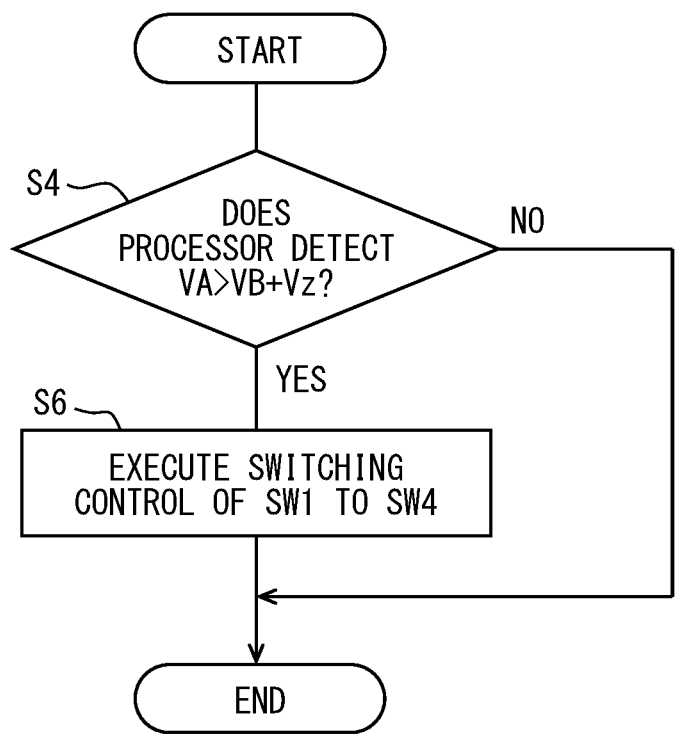
FIG. 8 is a flowchart that indicates a control content of a processor.

As shown in FIG. 7, an electronic control unit 13 according to a third embodiment includes a controller 4A, a controller 4B that replaces the processor 12, and a processor 14. The processor 14 controls switching of each of the transistors SW1 to SW4 separately from the controller 4B. As shown in FIG. 8, if an affirmative result (YES) is determined in S4, the processor 14 outputs a stop request of controlling the transistors SW1 to SW4 to the controller 4B. Subsequently, in S6, the processor 14 controls the switching of the transistors SW1 to SW4 to execute the over-boosting elimination control as similar to the second embodiment.

Other Embodiments

The high-side and low-side switches are not limited to N-channel MOSFETs. The setting of the Zener voltage Vz may be appropriately set according to individual settings without departing from the spirit of the present disclosure. The present disclosure has been described based on examples, but it is understood that the present disclosure is not limited to the examples or structures. The present disclosure encompasses various modifications and variations within the scope of equivalents. Furthermore, various combination and formation, and other combination and formation including one, more than one or less than one element may be made in the present disclosure.

What is claimed is:

1. An electronic control unit comprising:
    a booster circuit configured to charge a booster capacitor to boost a power supply voltage supplied from a battery;
    a high-side switch configured to drive an inductive load with a current by an output voltage of the booster circuit and the power supply voltage;
    a low-side switch configured to be selectively turned on or off to control an individual cylinder in an internal combustion engine;
    a controller configured to control the booster circuit, the high-side switch, and the low-side switch;
    a diode configured to allow a current to flow back to the booster capacitor from a connection node between the inductive load and the low-side switch; and
    a Zener diode being connected between the diode and the battery, the Zener diode configured to clamp a voltage applied to the booster capacitor, wherein
    an anode of the Zener diode is directly connected to the battery.

2. The electronic control unit according to claim 1, wherein:
    a value of a Zener voltage of the Zener diode is set to be larger than a set value of the output voltage of the booster circuit; and
    a value acquired by adding the value of the Zener voltage to a value of the power supply voltage is smaller than a value of a breakdown voltage of the booster capacitor.

3. The electronic control unit according to claim 1, further comprising:
    a processor configured to monitor a voltage at a cathode of the Zener diode.

4. The electronic control unit according to claim 3, wherein the controller is configured to execute over-boosting elimination control that prevents over-boosting of the power supply voltage in the booster circuit according to the voltage monitored by the processor.

5. The electronic control unit according to claim 3, wherein the processor configured to execute over-boosting elimination control that prevents over-boosting of the power supply voltage in the booster circuit according to the voltage monitored by the processor.

6. The electronic control unit according to claim 4, wherein the controller is configured to execute the over-boosting elimination control by stopping an operation of the booster circuit or switching off the high-side switch and the low-side switch.

7. The electronic control unit according to claim 5, wherein the processor is configured to execute the over-boosting elimination control by stopping an operation of the booster circuit or switching off the high-side switch and the low-side switch.

8. The electronic control unit according to claim 1, wherein
    a cathode of the Zener diode is directly connected to the diode.

9. The electronic control unit according to claim 1, wherein
    the diode is a first diode,
    the electronic control unit further comprising:
        a second diode,
    wherein
        a series connection of the first diode and the second diode is connected between an output terminal of the booster circuit and the low-side switch, and
        a cathode of the Zener diode is directly connected to a cathode of the first diode and an anode of the second diode.

10. The electronic control unit according to claim 9, wherein
    an anode of the first diode is connected to the low-side switch, and a cathode of the second diode is connected to the output terminal of the booster circuit.

* * * * *